(12) United States Patent
Xue et al.

(10) Patent No.: US 9,595,467 B2
(45) Date of Patent: Mar. 14, 2017

(54) AIR GAP FORMATION IN INTERCONNECTION STRUCTURE BY IMPLANTATION PROCESS

(71) Applicant: Applied Materials, Inc., Santa Clara, CA (US)

(72) Inventors: Jun Xue, San Jose, CA (US); Ludovic Godet, Sunnyvale, CA (US); Erica Chen, Cupertino, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/597,149

(22) Filed: Jan. 14, 2015

(65) Prior Publication Data

US 2016/0141202 A1  May 19, 2016

Related U.S. Application Data

(60) Provisional application No. 62/079,981, filed on Nov. 14, 2014.

(51) Int. Cl.
| | |
|---|---|
| H01L 21/786 | (2006.01) |
| H01L 21/311 | (2006.01) |
| H01L 21/3115 | (2006.01) |
| H01L 21/768 | (2006.01) |
| H01L 21/223 | (2006.01) |
| H01J 37/32 | (2006.01) |
| H01L 23/522 | (2006.01) |

(52) U.S. Cl.
CPC .... *H01L 21/7682* (2013.01); *H01J 37/32357* (2013.01); *H01J 37/32366* (2013.01); *H01J 37/32412* (2013.01); *H01J 37/32422* (2013.01); *H01L 21/2236* (2013.01); *H01L 21/31111* (2013.01); *H01L 21/31116* (2013.01); *H01L 21/31155* (2013.01); *H01L 21/768* (2013.01); *H01L 21/76825* (2013.01); *H01L 23/5222* (2013.01)

(58) Field of Classification Search
None
See application file for complete search history.

(56) References Cited

U.S. PATENT DOCUMENTS

| | | | |
|---|---|---|---|
| 6,346,446 B1 * | 2/2002 | Ritenour | 438/283 |
| 2005/0174876 A1 * | 8/2005 | Katoh | 365/232 |

(Continued)

*Primary Examiner* — Johannes P Mondt
(74) *Attorney, Agent, or Firm* — Patterson + Sheridan, LLP

(57) ABSTRACT

Methods for forming air gaps in an interconnection structure with desired materials formed on different locations of the interconnection structure using an ion implantation process to define an etching boundary followed by an etching process for semiconductor devices are provided. In one embodiment, a method for forming air gaps in an interconnection structure on a substrate, the method includes implanting ions in a first region of an insulating material disposed on a substrate, leaving a second region without implanted ions, the second region having a first surface interfaced with the first region and a second surface interfaced with the substrate, and performing an etching process to selectively etch the second region away from the substrate, forming an air gap between the first region and the substrate.

19 Claims, 8 Drawing Sheets

(56) References Cited

U.S. PATENT DOCUMENTS

2006/0017043 A1* 1/2006 Wu et al. .................. 252/372
2006/0091453 A1* 5/2006 Matsuda ........... H01L 29/66734
　　　　　　　　　　　　　　　　　　　　　257/330

* cited by examiner

AIR GAP FORMATION IN INTERCONNECTION STRUCTURE BY IMPLANTATION PROCESS

CROSS-REFERENCE TO RELATED APPLICATIONS

This application claims benefit of U.S. Provisional Application Ser. No. 62/079,981 filed Nov. 14, 2014, which is incorporated by reference in its entirety.

BACKGROUND

Field

Embodiments described herein generally relate to methods for forming a semiconductor device having an air gap. More specifically, embodiments described herein relate to an air gap interconnect formed by utilizing an ion implantation process along with an etching process Description of the Related Art Integrated circuits have evolved into complex devices that can include millions of components (e.g., transistors, capacitors and resistors) on a single chip. The demand for greater circuit density necessitates a reduction in the dimensions of the integrated circuit components, e.g., sub-micron dimensions and the use of various materials to fabricate devices in order to achieve much faster and better electrical performance, such as materials with higher conductivity used to form metal lines, materials with lower permittivity (low-k) dielectric constant used as an insulating layer, etc.

For integrated circuit fabrication, metal interconnects with low resistance, such as copper and aluminum interconnects, provide conductive paths between the integrated circuit components on integrated circuit devices. Generally, metal interconnects are electrically isolated from each other by a dielectric bulk insulating material. At sub-micron dimensions, capacitive coupling potentially occurs between adjacent metal interconnects, which may cause cross talk and/or resistance-capacitance (RC) delay and degrade the overall performance of the integrated circuit.

One method for forming vertical and horizontal interconnects for the integrated circuit is by a damascene or dual damascene method. Typically, damascene structures have dielectric bulk insulating layers and conductive metal layers, such as low dielectric constant materials (dielectric constant less than 4) and conductive copper layers, stacked on top of one another. Vertical interconnects, i.e., vias, and horizontal interconnects, i.e., trenches, are etched into the dielectric bulk insulating layer and the conductive metal wirings are subsequently filled into the vias and/or trenches and planarized, such as by a chemical mechanical planarization process (CMP), so that the conductive metal wirings are only left in the vias and/or trenches. In the damascene approach, a rather complex dielectric film stack that includes a sequence of hard mask, low-k dielectrics, etch stop layers, air gaps, etc., may be required.

Given the scaling performance limitations of conventional low-k materials in lowering the dielectric constant (k) as a result of compromising mechanical strength and current leakage performance, one promising candidate for capacitance scaling includes the adoption of air gaps between metal wiring. Air gaps, which have a k value near 1.0, help reduce the overall effective k value to acceptable levels within the device.

However, conventional deposition processes for forming an air gap in the interconnection structure often has poor dimension, size and profile control. For example, in the exemplary interconnection structure 100 depicted in FIG. 1, the interconnection structure 100 includes air gaps 114 formed in a first low-k insulating material 106 disposed on a second low-k insulating material 104 formed on a substrate 102. Conductive metal wirings 108 may be formed between the first and the second low-k insulating materials 106, 104.

As the conventional plasma enhanced chemical vapor deposition (PECVD) process utilized to form the air gaps 114 in the interconnection structure 100 may have different step-coverage (e.g., conformality) at different locations or different degrees of overhang at the corners of the vias while filling the first low-k insulating material 106 among the metal wirings 108, the resultant air gaps 114 formed within the first low-k insulating material 106 may have varying and unpredictable dimensions 110, 112, thus resulting in unreliable or unpredictable electrical performance of the integrated circuit.

Thus, there is a need for improved methods for forming air gaps in insulating materials of interconnection structures for integrated circuits having more reliable and predictable geometry.

SUMMARY

Methods for forming air gaps in interconnection structures for semiconductor devices are provided. The methods utilize an ion implantation process to implant ions into certain regions of a low-k insulating layer in the interconnection structure, thus providing different film properties in the low-k insulating layer for selectively forming air gaps therein. In one embodiment, a method for forming air gaps in an interconnection structure on a substrate, the method includes implanting ions in a first region of an insulating material disposed on a substrate, leaving a second region without implanted ions, the second region having a first surface interfaced with the first region and a second surface interfaced with the substrate, and performing an etching process to selectively etch the second region away from the substrate, forming an air gap between the first region and the substrate.

In another embodiment, a method for forming air gaps in an interconnection structure on a substrate includes altering film properties of a first region of an insulating material disposed on a substrate while retaining the film properties of a second region of the insulating material unchanged, and selectively removing the second region of the insulating material from the substrate to form air gaps between the first region and the substrate.

In yet another embodiment, a method for forming air gaps in an interconnection structure on a substrate includes forming an etching boundary by implanting ions to a first region of an insulating material disposed on a substrate to a predetermine depth, leaving a second region of the insulating material without ions implanted, and selectively removing the second region of the insulating material from the substrate using the predetermined depth as the etching boundary, wherein the second region of the insulating material removed from the substrate forms air gaps between the substrate and the etching boundary.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments described herein generally relate to air gap structure integration manufacturing process utilizing an ion implantation process and a selective etching process. More specifically, implantations of the present disclosure relate to utilize an ion implantation process for implanting dopants into a first region of a low-k insulating material to alter film properties in the first region of the low-k insulating material. Subsequently, a selective etching process is performed to selectively etch and/or remove a second region of the low-k insulating material without dopants implanted (e.g., without film properties alternation), forming air gaps in the interconnection structure. Details of the processing chambers and process flows will be discussed further below.

Figure 1:
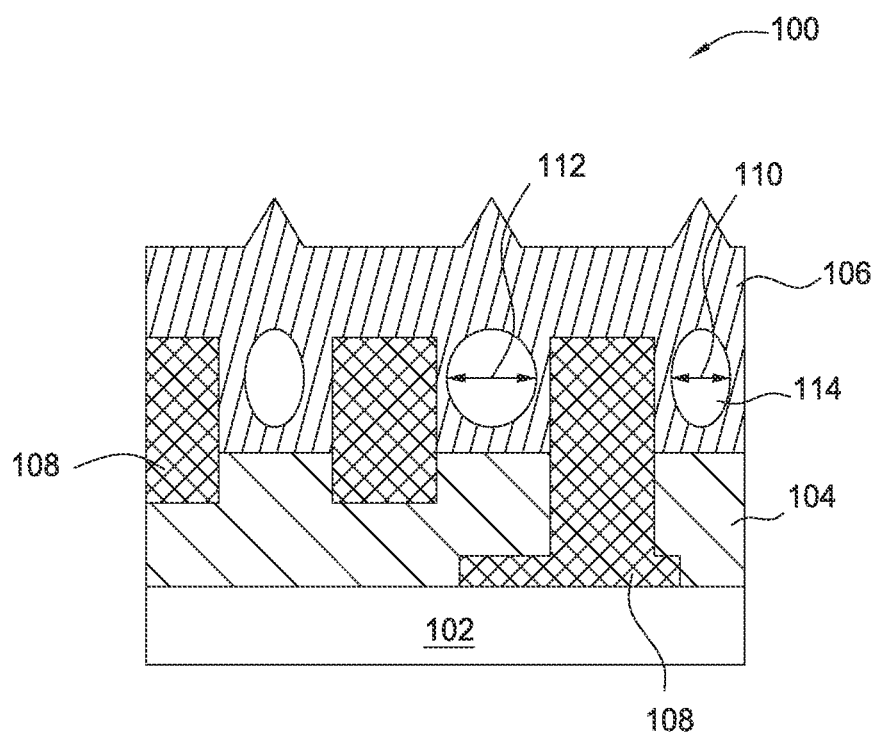
FIG. 1 depicts a schematic perspective view of a substrate having an interconnection structure formed by a conventional deposition manner.
Figure 2:
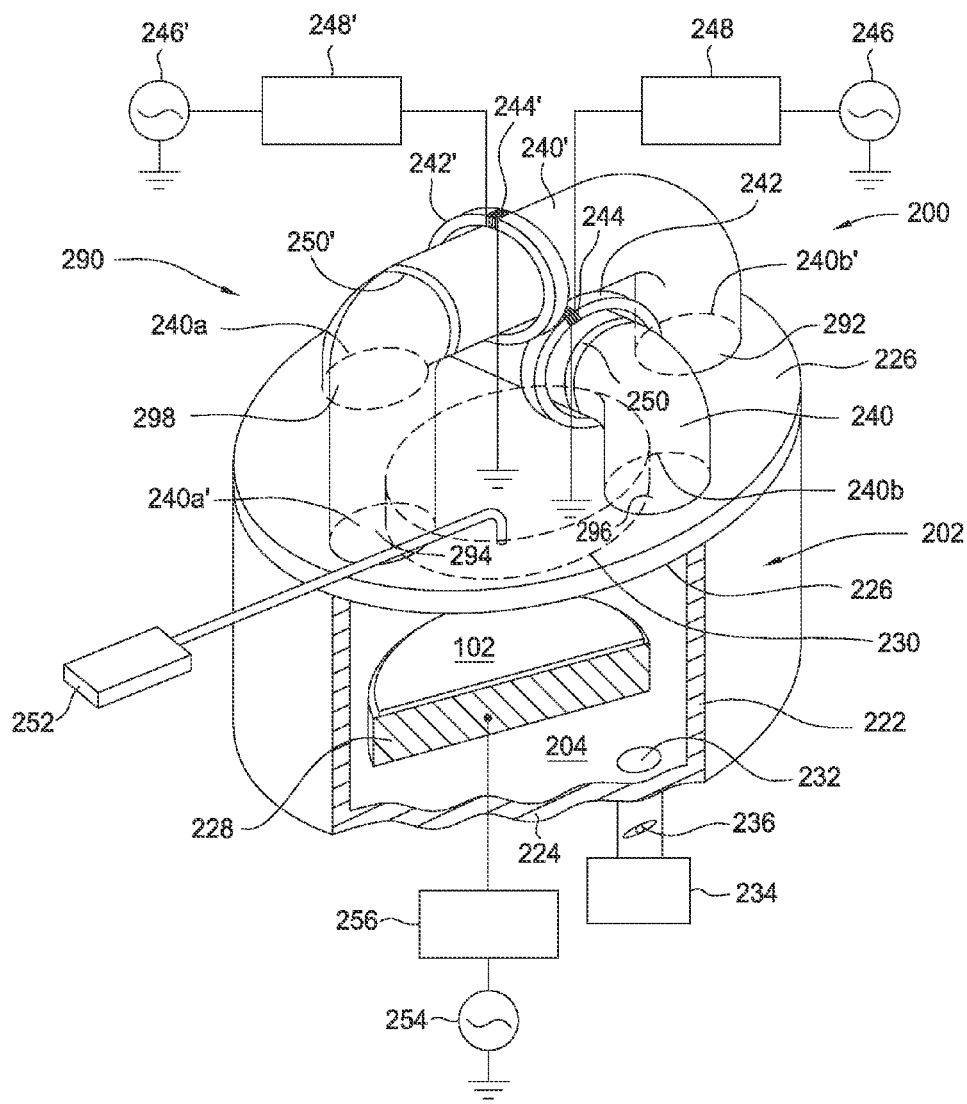
FIG. 2 depicts an apparatus which may be utilized to dope dopants into a structure on a substrate.

FIG. 2 depicts one example of a plasma immersion ion implantation chamber (i.e., processing chamber 200) suitable for implanting dopants into a material layer, such as a low-k insulating material, in accordance with at least one example of the present disclosure. The processing chamber 200 of FIG. 2 is useful for performing plasma immersion ion implantation procedures, but may also be used to shower a substrate with energetic ions to gently penetrate ions into the substrate. The processing chamber 200 includes a chamber body 202 having a bottom 224, a top 226, and side walls 222 enclosing a process region 204. A substrate support assembly 228 is supported from the bottom 224 of the chamber body 202 and is adapted to receive a substrate 102 for processing. In one example, the substrate support assembly 228 may include an embedded heater element or cooling element (not shown) suitable for controlling the temperature of the substrate 251 supported on the substrate support assembly 228. In one example, the temperature of the substrate support assembly 228 may be controlled to prevent the substrate 102 from overheating during the plasma immersion ion implantation process so as to maintain the substrate 102 at a substantially constant temperature during the plasma immersion ion implantation process. The temperature of the substrate support assembly 228 may be controlled between about 10 degrees Celsius to about 200 degrees Celsius.

A gas distribution plate 230 (shown in phantom) is coupled to the top 226 of the chamber body 202 facing the substrate support assembly 228. A pumping port 232 is defined in the chamber body 202 and coupled to a vacuum pump 234. The vacuum pump 234 is coupled through a throttle valve 136 to the pumping port 232. A process gas source 252 is coupled to the gas distribution plate 230 to supply gaseous precursor compounds for processes performed on the substrate 102.

The chamber 200 depicted in FIG. 2 further includes a plasma source 290. The plasma source 290 includes a pair of separate external reentrant conduits 240, 240' mounted on the outside of the top 226 of the chamber body 202 disposed transverse or orthogonal to one another. The first external reentrant conduit 240 has a first end 240a coupled to an opening 298 formed in the top 226 and is in communication with a first side of the process region 204 in the chamber body 202. A second end 240b has an opening 296 coupled to the top 226 and is in communication with a second side of the process region 204. The second external reentrant conduit 240' has a first end 240a' having an opening 294 coupled to the top 226 and in communication with a third side of the process region 204. A second end 240b' having an opening 292 of the second external reentrant conduit 240' is coupled to the top 226 and is in communication with a fourth side of the process region 204. In one example, the first and second external reentrant conduits 240, 240' are configured to be orthogonal to one another, thereby providing the two ends 240a, 240a', 240b, 240b' of each external reentrant conduits 240, 240' orientated at about 90 degree intervals around the periphery of the top 226 of the chamber body 202. The orthogonal configuration of the external reentrant conduits 240, 240' allows a plasma source distributed uniformly across the process region 204. It is contemplated that the first and second external reentrant conduits 240, 240' may have other configurations utilized to control plasma distribution in the process region 204.

Magnetically permeable torroidal cores 242, 242' surround a portion of a corresponding one of the external reentrant conduits 240, 240'. The conductive coils 244, 244' are coupled to respective RF power sources 246, 146' through respective impedance match circuits or elements 248, 248'. Each external reentrant conduits 240, 240' is a hollow conductive tube interrupted by an insulating annular ring 250, 250' respectively that interrupts an otherwise continuous electrical path between the two ends 240a, 240b (and 240a', 204b') of the respective external reentrant conduits 240, 240'. Ion energy at the substrate surface is controlled by an RF bias generator 254 coupled to the substrate support assembly 228 through an impedance match circuit or element 256.

Process gases including gaseous compounds supplied from the process gas source 252 are introduced through the overhead gas distribution plate 230 into the process region 204. RF power source 246 is coupled from the power applicators, i.e., core and coil, 242, 244 to gases supplied in the first external reentrant conduit 240, which creates a circulating plasma current in a first closed torroidal path RF power source 246' may be coupled from the other power applicators, i.e., core and coil, 242', 244' to gases in the second conduit 240', which creates a circulating plasma current in a second closed torroidal path transverse (e.g., orthogonal) to the first torroidal path. The second torroidal path includes the second external reentrant conduit 240' and the process region 204. The plasma currents in each of the paths oscillate (e.g., reverse direction) at the frequencies of the respective RF power sources 246, 246', which may be the same or slightly offset from one another.

In operation, a process gas mixture is provided to the chamber from the process gas source 252. Depending on implementation, the process gas mixture may comprise inert and/or reactive gases to be ionized and directed toward the substrate 102. Virtually any gas that may be easily ionized can be used in the chamber 200 to practice implementations of the disclosure. Some inert gases that may be used include helium, argon, neon, krypton, and xenon. Reactive or reactable gases that may be used include oxygen containing gas, nitrogen containing gases, halogen containing gas, hydrogen containing gases, silicon containing gas, carbon containing gases, and combinations thereof. In some embodiments, nitrogen gas, hydrogen gas, oxygen gas, and combinations thereof may be used. In other implementations, ammonia and its derivatives, analogues, and homologues, may be used, or hydrocarbons such as methane or ethane may be used. Any substance that may be readily vaporized, and that does not deposit a material substantially identical to the magnetically susceptible layer of the substrate, may be used to modify its magnetic properties through bombardment or plasma immersion ion implantation.

Each RF power source 246, 246' is operated so that their combined effect efficiently dissociates the process gases supplied from the process gas source 252 and produces a desired ion flux at the surface of the substrate 102. The power of the RF bias generator 254 is controlled at a selected level at which the ion energy dissociated from the process gases may be accelerated toward the substrate surface and implanted at a desired depth below the top surface of the substrate 102 in a desired ion concentration. For example, with relatively low RF power of about 100 W would give ion energy of about 200 eV. Dissociated ions with low ion energy may be implanted at a shallow depth between about 1 Å and about 500 Å from the substrate surface. Alternatively, high bias power of about 5000 W would give ion energy of about 6 keV. The dissociated ions with high ion energy provided and generated from high RF bias power, such as higher than about 100 eV, may be implanted into the substrate having a depth substantially over 500 Å depth from the substrate surface. In one embodiment, the bias RF power supplied to the chamber may be between about 100 watts and about 7000 watts, which equates to ion energy between about 100 eV and about 7 keV. It is noted that multiple step of implantation may be performed, e.g., supplying different RF powers at different period of time during operation, so as to obtain uniform implantation profile implanted into a substrate.

The combination of the controlled RF plasma source power and RF plasma bias power (also including the options of DC bias power or pulsed RF or pulsed DC powers) dissociates electrons and ions in the gas mixture, imparts a desired momentum to the ions, and generates a desired ion distribution in the processing chamber 200. The ions are biased and driven toward the substrate surface, thereby implanting ions into the substrate in a desired ion concentration, distribution and depth from the substrate surface. In some embodiments, ions may be implanted at a concentration between about $10^{15}$ atoms/cm$^3$ and about $10^{23}$ atoms/cm$^3$ at a depth ranging from about 5 nm to about 500 nm, depending on the thickness of the material layer disposed on the substrate 102.

Plasma immersion implanting ions deep in the material layer disposed on a substrate may cause bonding structure change in the implanted area. The degree of change may be selected by tuning the depth of the implant. The size of ion being implanted will also affect the energy needed to implant ions to a given depth. For example, helium ions implanted into a material layer at an average energy of about 200 eV will change film properties of the material layer by about 20% to about 50%, and argon ions implanted at an average energy of about 1,000 eV will demagnetize and/or change film properties the material layer by about 50% to about 80%, comparatively.

It is noted that the ions provided in a plasma immersion ion implantation process, as described herein, are generated from a plasma formed by applying a high voltage RF or any other forms of EM field (microwave or DC) to a processing chamber. The plasma dissociated ions are then biased toward the substrate surface and implanted into a certain desired depth from the substrate surface.

It is noted that a conventional ion implantation processing chamber may also utilized to practice the embodiments of the present disclosure, which will be disclosed below with referenced from FIG. 3A to FIG. 4). Conventional ion implantation processing chamber utilizing ion guns or ion beams accelerates a majority of ions up to a certain energy resulting in implanting accelerated ions into a certain deeper region of the substrate, as compared to the ions implanted by the plasma immersion ion implantation process. The ions provided in the plasma immersion ion implantation process do not generally have a beam-like energy distribution as the ions in conventional beamliners. However, under suitable adjustment of process parameters, ion implantation performance from the plasma immersion ion implantation process and the conventional ion beam implantation process may have similar results to have the desired ions implanted into a material layer with desired profile and distribution. In most of the embodiments, the higher energy required from the conventional ion gun (or an ion beam) ion implantation process can provide ions with higher implantation energy to penetrate into a deeper region from the substrate surface. In contrast, the plasma immersion ion implantation process utilizing RF power to plasma dissociate ions for implanting requires less energy to initiate the plasma immersion ion implantation process so that the ions generated from the plasma can be implanted into a relatively shadow depth from the substrate surface.

Figure 3A:
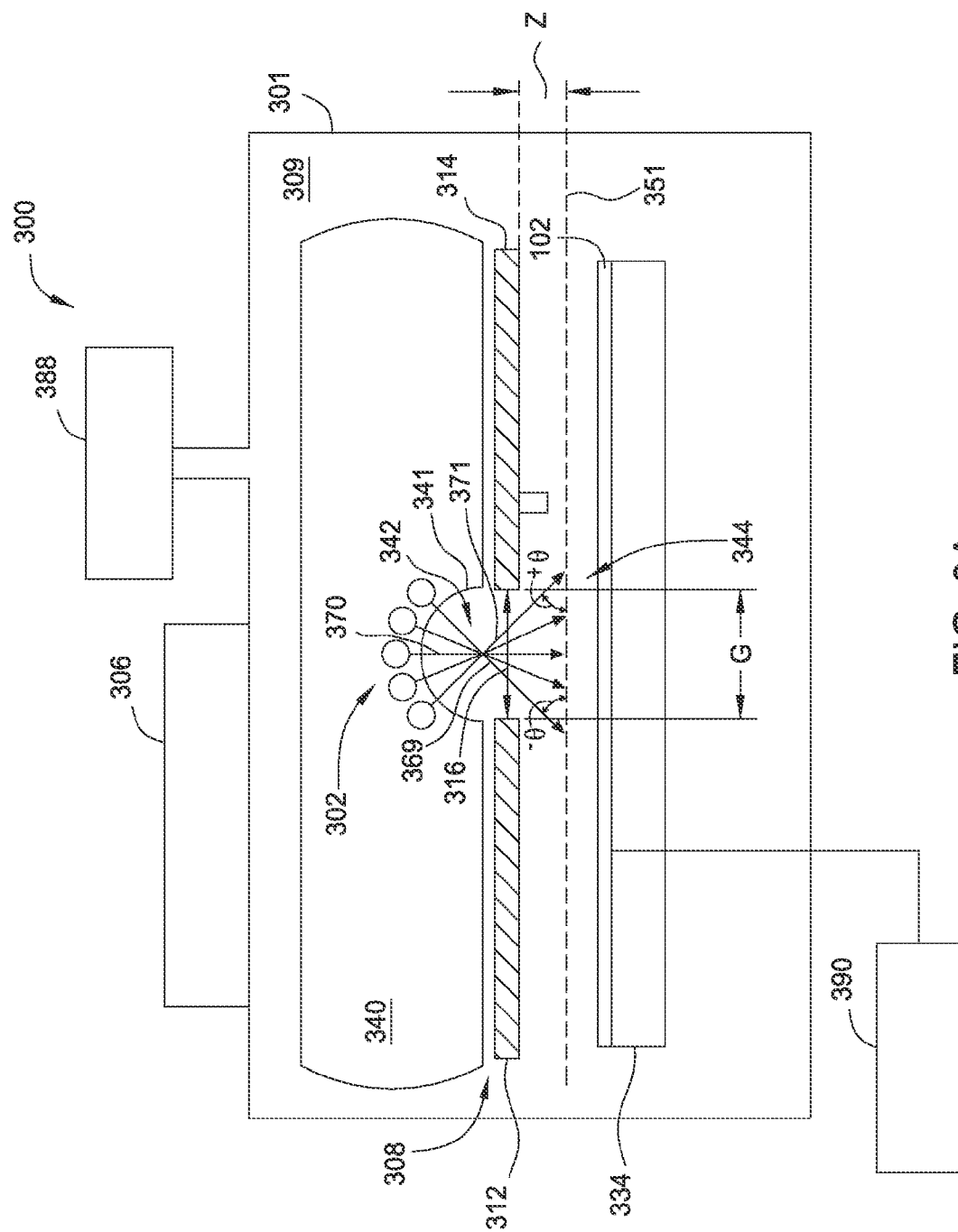
FIG. 3A depicts an apparatus which may be utilized to dope dopants into a structure on a substrate.

FIG. 3A is a sectional view of one embodiment of a processing chamber 300 suitable for doping dopants into a substrate. Suitable processing chambers that may be adapted for use with the teachings disclosed herein include, for example, a processing chamber available from Applied Materials, Inc. of Santa Clara, Calif. Although the processing chamber 300 is shown having a plurality of features that enable ion doping performance, it is contemplated that other processing chambers from other manufactures may also be adapted to benefit from one or more of the inventive features disclosed herein. The processing chamber 300 as described herein may be utilized as a plasma doping apparatus. However, the processing chamber 300 may also include, but not be limited to, etching and deposition systems. Furthermore, the plasma doping apparatus can perform many differing material modification processes on a substrate. One such process includes doping a substrate, such as a semiconductor substrate, with desired dopants.

The processing chamber 300 may include chamber body 301 defining an interior processing region 309. A substrate support 334 is disposed in the processing chamber 300. The substrate 102 may be disposed on the substrate support 334 during a directional plasma process. The substrate 102 may include, but not be limited to, a semiconductor wafer, flat panel, solar panel, and polymer substrate. The semiconductor wafer may have a disk shape with a diameter of 200 millimeters (mm), 300 millimeters (mm) or 450 millimeters (mm) or other size, as needed.

A RF plasma source 306 is coupled to the chamber body 301 and configured to generate a plasma 340 in the processing chamber 300. In the embodiment of FIG. 3A, a plasma sheath modifier 308 is disposed in the interior processing region 309. The plasma sheath modifier 308 includes a pair of modifier 312, 314 defining a gap 316 therebetween. The gap 316 defines a horizontal spacing (G). In some embodiments, the plasma sheath modifier 308 may include an insulator, conductor or semiconductor. The pair of modifiers 312, 314 may be a pair of sheets having a thin, flat shape. In other embodiments, the pair of modifiers 312, 314 may be other shapes such as tube shaped, wedge shaped, and/or have a beveled edge proximate the gap 316. In one embodiment, the modifiers 312, 314 may be fabricated of quartz, alumina, boron nitride, glass, polysilicon, silicon nitride, silicon carbide, graphite and the like.

In one embodiment, the horizontal spacing of the gap 316 defined by the pair of modifiers 312, 314 may be about 6.0 millimeters (mm). The pair of modifiers 312, 314 may also be positioned to define a vertical spacing (Z) above a plane 351. The plane 351 is defined by a front surface of the substrate 238 or a surface of the substrate support 334. In one embodiment, the vertical spacing (Z) may be about 3.0 mm.

A gas source 388 is coupled to the processing chamber 300 to supply an ionizable gas to the interior processing region 209. Examples of an ionizable gas include, but are not limited to, $BF_3$, $Bl_3N_2$, Ar, $PH_3$, $AsH_3$, $B_2H_6$, $H_2$, $N_2$, $NH_3$, $O_2$, Xe, Kr, Ne, He, $SiH_4$, $SiF_4$, $SF_6$, $C_2F_6$, $CHF_3$, $GeH_4$, $GeF_4$, $CH_4$, $CF_4$, $AsF_5$, $PF_3$ and $PF_5$. The plasma source 306 may generate the plasma 340 by exciting and ionizing the gas provided to the processing chamber 300. Ions in the plasma 340 may be attracted across the plasma sheath 342 by different mechanisms. In the embodiment of FIG. 3A, a bias source 390 is coupled to the substrate support 334 configured to bias the substrate 338 to attract ions 302 from the plasma 340 across the plasma sheath 342. The bias source 390 may be a DC power supply to provide a DC voltage bias signal or an RF power supply to provide an RF bias signal.

It is believed that the plasma sheath modifier 308 modifies the electric field within the plasma sheath 342 to control a shape of the boundary 341 between the plasma 340 and the plasma sheath 342. The boundary 341 between the plasma 340 and the plasma sheath 342 may have a convex shape relative to the plane 351. When the bias source 390 biases the substrate 102, ions 302 are attracted across the plasma sheath 342 through the gap 316 defined between the modifiers 312, 314 through a large range of incident angles. For instance, ions 302 following trajectory path 371 may strike the substrate 102 at an angle of positive θ (+θ) relative to the plane 351. Ions following trajectory path 370 may strike perpendicularly on the substrate 102 at about an angle of about 90 degrees relative to the same plane 351. Ions following trajectory path 369 may strike the substrate 102 at an angle of negative θ (−θ) relative to the plane 351. Accordingly, the range of incident angles may be between about positive θ (+θ) and about negative θ (−θ), centered about 90 degrees. In addition, some ion trajectories paths such as paths 369 and 371 may cross each other. Depending on a number of factors including, but not limited to, the horizontal spacing (G) between the modifiers 312 and 314, the vertical spacing (Z) of the plasma sheath modifier 308 above the plane 351, the dielectric constant of the modifiers 312, 314, and other plasma process parameters, the range of incident angles (θ) may be between +60 degree and −60 degree centered about 0 degree. Hence, small three dimensional structures on the substrate 102 may be treated uniformly by the ions 302.

Figure 3B:
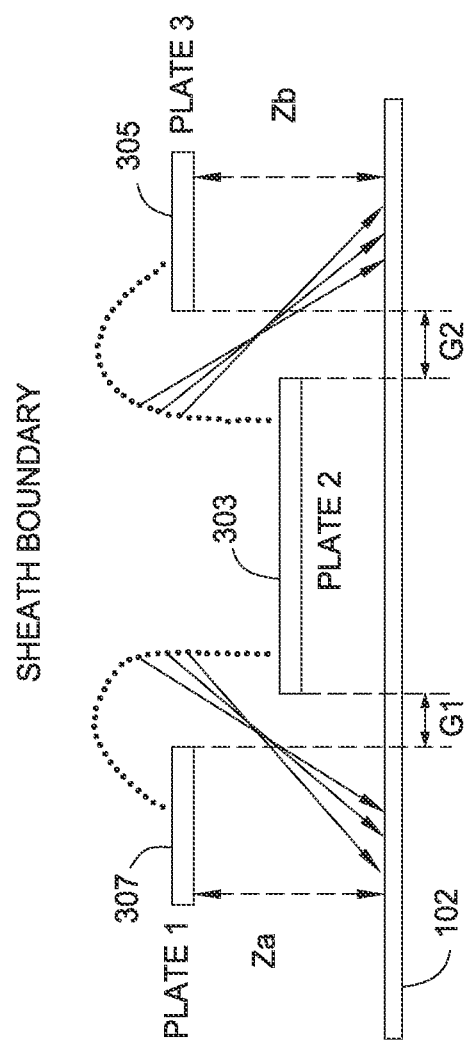
FIG. 3B depicts another example of an apparatus which may be utilized to dope dopants into a structure on a substrate.

Referring to FIG. 3B, instead of a pair of modifiers 312, 314 depicted in FIG. 3A, at least three modifiers 303, 305, 307 are used to control the ions with desired angular distribution to the substrate 102. By arranging the outer two modifiers 307, 305 on a common plane equally shaped a distance Za above the substrate 102, the same vertical plane (Za), and by maintaining equal horizontal spacing G1, G2 between the modifiers 303, 305, 307, a symmetric bimodal angular spread of ions, centered about +/−θ (+θ and −θ) degrees may be obtained. As described above, the incidental angles ions doped onto the substrate 102 may be modified by varying the vertical spacing between the outer modifiers 305, 307 and the middle modifier 303, so as to vary the gap angles. The angular ion spread can be modified by varying the horizontal spacing (G1, G2) between the modifiers 303, 305, 307, so as to vary the gap width defined by the horizontal spacing (G1, G2). An asymmetric distribution can be created by making Za different than Zb, by choosing G1 different than G2, or a combination of both actions. In one embodiment, the angular ion spread can be modified from between about 0 degree and about 30 degrees from the center to only treat or implant ions into one side of a structure.

Figure 4:
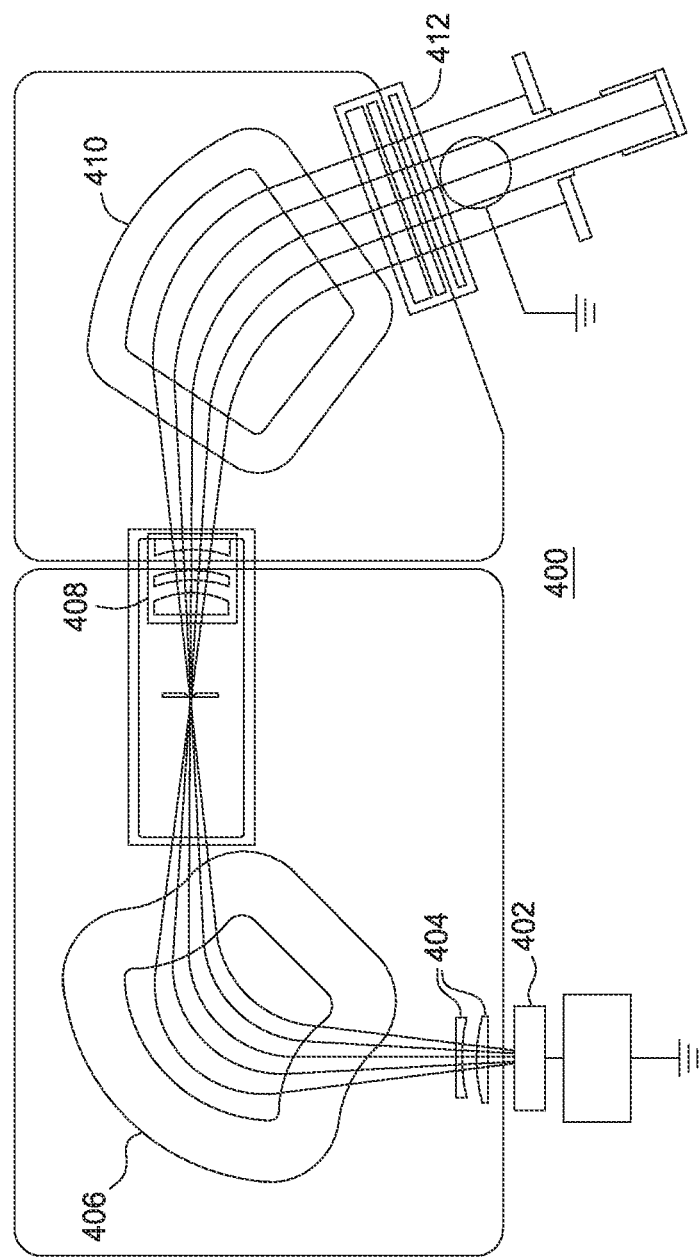
FIG. 4 depicts another example of an apparatus which may be utilized to dope dopants into a structure on a substrate.

FIG. 4 depicts a conventional ion implanting processing chamber 400 that may be utilized to dope ions into certain regions of the substrate. The ion implanting processing chamber 400 includes an ion source 402, extraction electrodes 404, a 90 degree magnet analyzer 406, a first deceleration (D1) stage 408, a magnet analyzer 410, and a second deceleration (D2) stage 412. The deceleration stages D1, D2 (also known as "deceleration lenses") are each comprised of multiple electrodes with a defined aperture to allow an ion beam to pass therethrough. By applying different combinations of voltage potentials to the multiple electrodes, the deceleration lenses D1, D2 can manipulate ion energies and cause the ion beam to hit a target wafer at a desired energy which implants ions into a substrate. The above-mentioned deceleration lenses D1, D2 are typically electrostatic triode (or tetrode) deceleration lenses.

Figure 5:
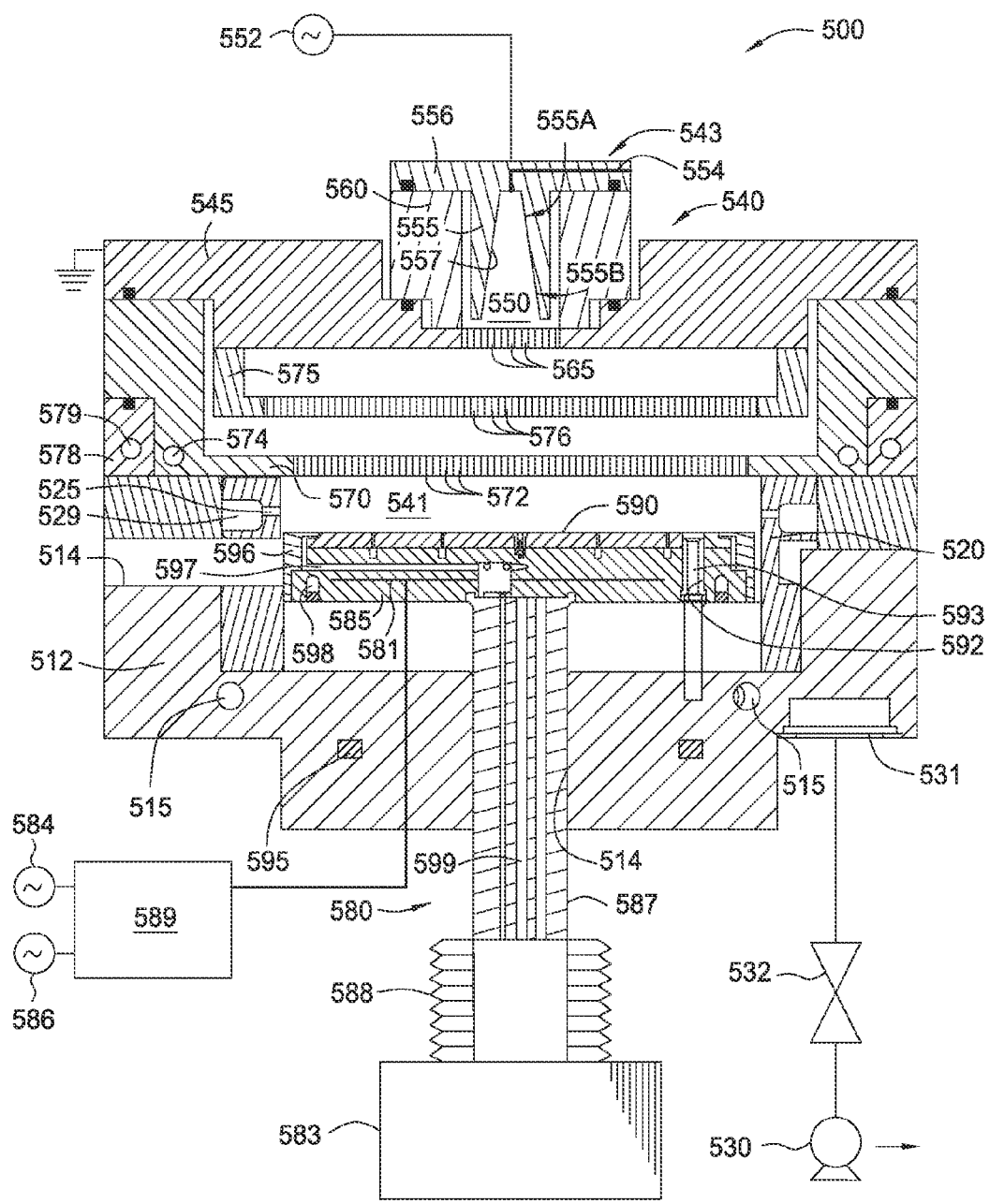
FIG. 5 depict an apparatus that may be utilized to perform an selective etching process.

FIG. 5 is a cross sectional view of an illustrative processing chamber 500 suitable for conducting an etching process as further described below. The chamber 500 may be configured to remove material from a material layer disposed on a substrate surface. The chamber 500 is particularly useful for performing the plasma assisted dry etch process. The processing chamber 500 may be suitably adapted a Siconi™, Capa™, or Frontier™ processing chamber, which are available from Applied Materials, Santa Clara, Calif. It is noted that other vacuum processing chambers available from other manufactures may also be adapted to practice the present disclosure.

The processing chamber 500 includes a chamber body 512, a lid assembly 540, and a support assembly 580. The lid assembly 540 is disposed at an upper end of the chamber body 512, and the support assembly 580 is at least partially disposed within the chamber body 512.

The chamber body 512 includes a slit valve opening 514 formed in a sidewall thereof to provide access to the interior of the processing chamber 500. The slit valve opening 514 is selectively opened and closed to allow access to the interior of the chamber body 512 by a wafer handling robot (not shown).

In one or more implementations, the chamber body 512 includes a channel 515 formed therein for flowing a heat transfer fluid therethrough. The chamber body 512 can further include a liner 520 that surrounds the support assembly 580. The liner 520 is removable for servicing and cleaning. In one or more embodiments, the liner 520 includes one or more apertures 525 and a pumping channel 529 formed therein that is in fluid communication with a vacuum system. The apertures 525 provide a flow path for gases into the pumping channel 529, which provides an egress for the gases within the processing chamber 500.

The vacuum system can include a vacuum pump 530 and a throttle valve 532 to regulate flow of gases through the processing chamber 500. The vacuum pump 530 is coupled to a vacuum port 531 disposed in the chamber body 512 and therefore, in fluid communication with the pumping channel 529 formed within the liner 520. The lid assembly 540 includes at least two stacked components configured to form a plasma volume or cavity therebetween. In one or more embodiments, the lid assembly 540 includes a first electrode 543 ("upper electrode") disposed vertically above a second electrode 545 ("lower electrode") confining a plasma volume or cavity 550 therebetween. The first electrode 543 is connected to a power source 552, such as an RF power supply, and the second electrode 545 is connected to ground, forming a capacitance between the two electrodes 543, 545.

In one or more implementations, the lid assembly 540 includes one or more gas inlets 554 (only one is shown) that are at least partially formed within an upper section 556 of the first electrode 543. The one or more process gases enter the lid assembly 540 via the one or more gas inlets 554. The one or more gas inlets 554 are in fluid communication with the plasma cavity 550 at a first end thereof and coupled to one or more upstream gas sources and/or other gas delivery components, such as gas mixers, at a second end thereof. In one or more embodiments, the first electrode 543 has an expanding section 555 that houses the plasma cavity 550.

In one or more implementations, the expanding section 555 is an annular member that has an inner surface or diameter 557 that gradually increases from an upper portion 555A thereof to a lower portion 555B thereof. As such, the distance between the first electrode 543 and the second electrode 545 is variable. The varying distance helps control the formation and stability of the plasma generated within the plasma cavity 550. A plasma generated in the plasma cavity 550 is defined in the lid assembly 540 prior to entering into a processing region 541 above the support assembly 580 wherein the substrate is proceed, the plasma is considered as a remote plasma source that generated remotely from the processing region 541.

The lid assembly 540 can further include an isolator ring 560 that electrically isolates the first electrode 543 from the second electrode 545. The lid assembly 540 can further include a distribution plate 570 and blocker plate 575 adjacent the second electrode 545. The second electrode 545, distribution plate 570 and blocker plate 575 can be stacked and disposed on a lid rim 578 which is connected to the chamber body 512. In one or more implementations, the second electrode (or top plate) 545 can include a plurality of gas passages or apertures 565 formed beneath the plasma cavity 550 to allow gas from the plasma cavity 550 to flow therethrough. The distribution plate 570 is substantially disc-shaped and also includes a plurality of apertures 572 or passageways to distribute the flow of gases therethrough. In one or more embodiments, the distribution plate 570 includes one or more embedded channels or passages 574 for housing a heater or heating fluid to provide temperature control of the lid assembly 540. The blocker plate 575 includes a plurality of apertures 576 to provide a plurality of gas passages from the second electrode 545 to the distribution plate 570. The apertures 576 can be sized and positioned about the blocker plate 575 to provide a controlled and even flow distribution of gases to the distribution plate 570.

The support assembly 580 can include a support member 585 to support a substrate (not shown in this view) for processing within the chamber body 512. The support member 585 can be coupled to a lift mechanism 583 through a shaft 587 which extends through a centrally-located slit valve opening 514 formed in a bottom surface of the chamber body 512. The lift mechanism 583 can be flexibly sealed to the chamber body 512 by a bellows 588 that prevents vacuum leakage from around the shaft 587.

In one embodiment, the electrode 581 that is coupled to a plurality of RF bias power sources 584, 586. The RF bias power sources 584, 586 are coupled between the electrode 581 disposed in the support member 585. The RF bias power excites and sustains a plasma discharge formed from the gases disposed in the processing region 541 of the chamber body.

In the embodiment depicted in FIG. 5, the dual RF bias power sources 584, 586 are coupled to the electrode 581 disposed in the support member 585 through a matching circuit 589. The signal generated by the RF bias power sources 584, 586 is delivered through matching circuit 589 to the support member 585 through a single feed to ionize the gas mixture provided in the processing chamber 500, thereby providing ion energy necessary for performing a deposition or other plasma enhanced process. The RF bias power sources 584, 586 are generally capable of producing an RF signal having a frequency of from about 50 kHz to about 200 MHz and a power between about 0 Watts and about 5000 Watts. Additional bias power sources may be coupled to the electrode 581 to control the characteristics of the plasma as needed.

The support member 585 can include bores 592 formed therethrough to accommodate lift pins 593, one of which is shown in FIG. 5. Each lift pin 593 is constructed of ceramic or ceramic-containing materials, and are used for substrate-handling and transport. The lift pin 593 is moveable within its respective bore 592 when engaging an annular lift ring 595 disposed within the chamber body 512. The support assembly 580 can further include an edge ring 196 disposed about the support member 585.

The temperature of the support assembly 580 can be controlled by a fluid circulated through a fluid channel 598 embedded in the body of the support member 585. In one or more implementations, the fluid channel 598 is in fluid communication with a heat transfer conduit 599 disposed through the shaft 587 of the support assembly 580. The fluid channel 598 is positioned about the support member 585 to provide a uniform heat transfer to the substrate receiving surface of the support member 585. The fluid channel 598 and heat transfer conduit 599 can flow heat transfer fluids to either heat or cool the support member 585. Any suitable heat transfer fluid may be used, such as water, nitrogen, ethylene glycol, or mixtures thereof. The support assembly 580 can further include an embedded thermocouple (not shown) for monitoring the temperature of the support surface of the support member 585. For example, a signal from the thermocouple may be used in a feedback loop to control the temperature or flow rate of the fluid circulated through the fluid channel 598.

The support member 585 can be moved vertically within the chamber body 512 so that a distance between support member 585 and the lid assembly 540 can be controlled. A sensor (not shown) can provide information concerning the position of support member 585 within chamber 500.

A system controller (not shown) can be used to regulate the operations of the processing chamber 500. The system controller can operate under the control of a computer program stored on a memory of a computer. The computer program may include instructions that enable the preclean process described below to be performed in the processing chamber 500. For example, the computer program can dictate the process sequencing and timing, mixture of gases, chamber pressures, RF power levels, susceptor positioning, slit valve opening and closing, wafer cooling and other parameters of a particular process.

Figure 6:
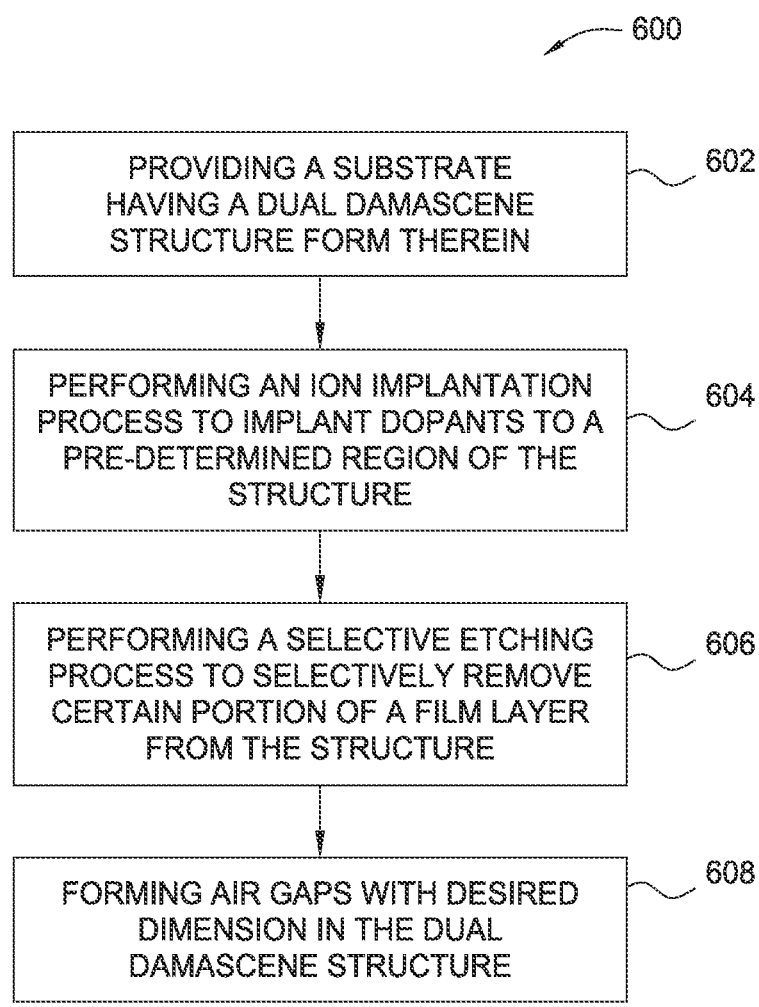
FIG. 6 depicts a flow diagram of a method for forming air gaps in an interconnection structure disposed on a substrate.
Figure 7A:
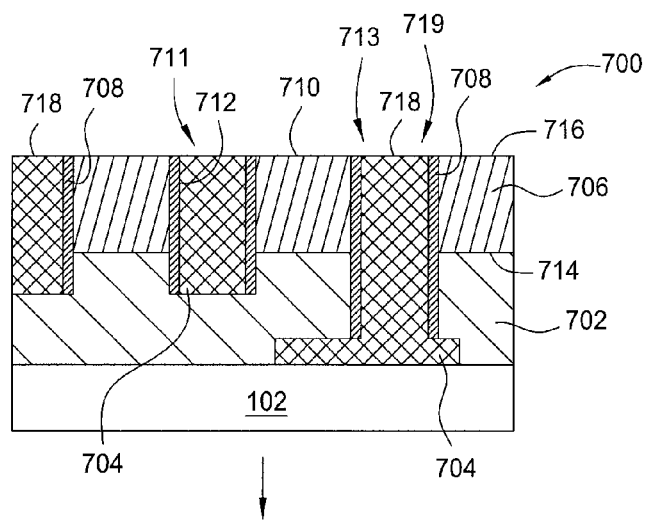
FIGS. 7A-7C depict one example of a sequence for forming air gaps in an interconnection structure utilizing the process depicted in FIG. 6.
Figure 7B:
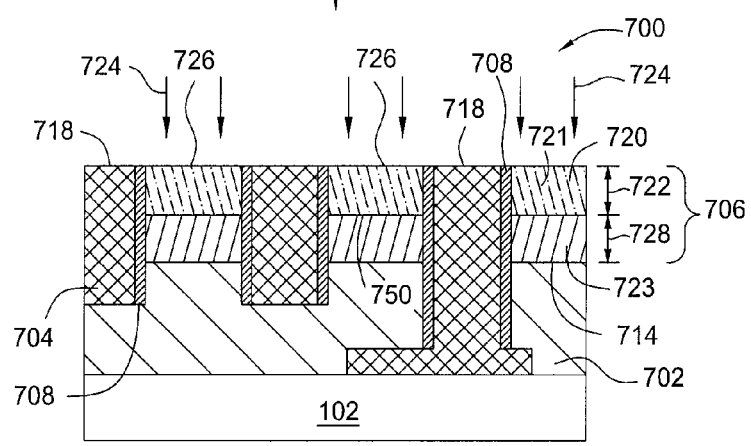
Figure 7C:
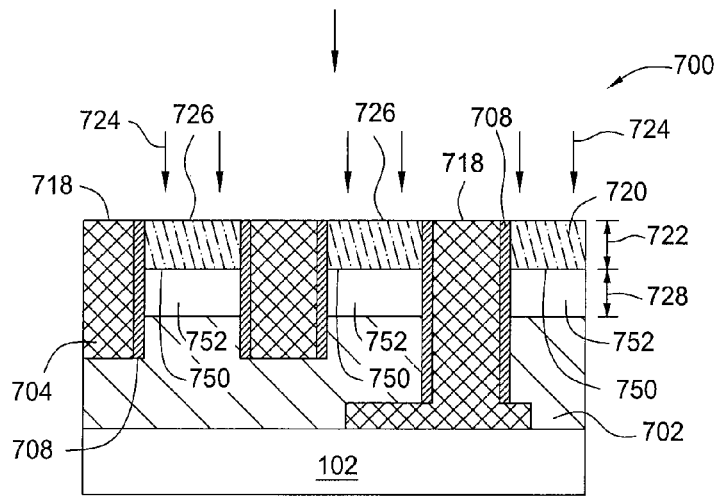

FIG. 6 is a flow diagram of one implementation of an ion implantation method 600 utilized to alter film properties in certain region of an insulating material in an interconnection structure so as to promote etching selectivity during the subsequent etching process. The interconnection structure may be a back-end interconnection structure, a damascene structure, a dual damascene structure, a fin structure, a gate structure, a contact structure, or any other suitable structures utilized in semiconductor applications. FIGS. 7A-7C are schematic cross-sectional views of a portion of a composite substrate 102 corresponding to various stages of the method 600. The method 600 may be utilized to form interconnection structures, such as damascene structures or dual damascene structures, on a substrate having desired materials formed on different regions of the interconnection structure for semiconductor applications. Alternatively, the method 600 may be beneficially utilized to form other types of structures.

The method 600 begins at operation 602 by providing a substrate, such as the substrate 102 depicted in FIG. 7A. The substrate may have a plurality of structures 700, such as interconnection structures, formed thereon, as shown in FIG. 7A. In one example. The interconnection structure is a damascene structure or a dual damascene structure. In one embodiment, the substrate 102 may be made of a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 102 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In embodiments wherein a SOI structure is utilized for the substrate 102, the substrate 102 may include a buried dielectric layer disposed on a silicon crystalline substrate. In the embodiment depicted in FIGS. 7A-7C, the substrate 102 may be a crystalline silicon substrate. Moreover, the substrate 102 is not limited to any particular size or shape. The substrate 102 may be a round substrate having a 200 mm diameter, a 300 mm diameter or other diameters, such as 450 mm, among others. The substrate 102 may also be any polygonal, square, rectangular, curved or otherwise non-circular workpiece, such as a polygonal glass substrate used in the fabrication of flat panel displays.

In one example, the interconnection structure 700 formed on the substrate 102 is a dual damascene structure utilized in the back end semiconductor process. The interconnection structure 700 includes a first insulating layer 702 disposed on the substrate 102 having openings 719 formed therein configured to have at least one conductive wirings 704, such as copper line, disposed therein laterally bounded by the first insulating layer 702. A second insulating layer 706 is formed on the first insulating layer 702 at least partially circumscribing the conductive wirings 704. The opening 719 may include a trench 711 and/or a via 713 formed in the first and second insulating layers 702, 706 by a suitable etching process, such as dual damascene etching process, and then filled by the conductive wirings 704 by suitable deposition techniques. A metal liner layer 708 may be formed on sidewalls 712 of the conductive wirings 704 to protect the conductive wirings 704 and prevent the conductive wirings 704 from in direct contact with the insulating layers 702, 706.

In one embodiment, the first and second insulating layers 702, 706 are dielectric materials having dielectric constant less than 4.0 (e.g., a low-k material). Examples of suitable low-k materials include carbon-containing silicon oxides (SiOC), such as BLACK DIAMOND® dielectric material available from Applied Materials, Inc., and other low-k polymers, such as polyamides. Alternatively, the first and second insulating layers 702, 706 may be any suitable dielectric materials, such as silicon oxide, TEOS, silicon oxynitride, amorphous carbon, silicon carbide and the like. In the embodiment depicted in FIG. 7A-7C, the first and second insulating layers 702, 706 are carbon-containing silicon oxide (SiOC) layers. The metal liner layer 708 has a metal containing dielectric layer, such as TiN, TaN, TiON, TiO, TaON, TaO, alloys thereof and the like.

The insulating layers 706, 702 may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed. In one embodiment, the insulating layers 706, 702 are formed by a flowable or plasma enhanced chemical vapor deposition (CVD).

At operation 604, an ion doping/implantation process (or an ion immersion plasma process), utilizing one of the exemplary chambers 200, 300, 400 depicted in FIGS. 2-4, is performed to dope, coat, treat, implant, insert, immerse or modify certain film/surface properties on certain locations of the second insulating layer 706 to form a treated region 720 in the second insulating layer 706, as shown in FIG. 7B. The ion doping/implantation process implant ions 724 to predominantly modify film/surface properties on predominantly a portion of the second insulating layer 706, such as the upper portion 721 of the second insulating layer 706, forming the treated region 720 in the second insulating layer 706. The dopants utilized to treat in the treated region 720 change and/or modify part of the film properties of the second insulating layer 706, so as to provide a film property of the treated region 720 different from a film property of the lower portion 723 which receives substantially no dopants compared to the upper portion 721 during the ion doping/treatment process.

The ion implantation process is performed by implanting ions 724, as shown in FIG. 7B, to a selected region, such as the upper portion 721 of the second insulating layer 706, to form the treated region 720 with a desired film property change. While forming the treated region 720, non-selected region, such as the lower portion 723 of the second insulating layer 706, does not receive significant amount of ions/dopants, and thus fails to undergo a film property change and form a treated region. The ions, which include a desired type of atoms, may be doped into the upper portion 721 of the second insulating layer 706, forming the treated region 720 creating an interface 750 facing with the unchanged/unmodified lower portion 723 of the second insulating layer 706. The ions may treat, bombard, and/or modify atom/bonding structures in the upper portion 721 of the second insulating layer 706, so as to result in film bonding structures different from other regions, such as the lower portion 723 of the second insulating layer 706 which do not receive ion treatment. The treated region 720 may form the interface 750 between the treated region 720 and the untreated lower portion 723. In one embodiment, the interface 750 may be formed at a depth 722 of between about 10 nm and about 500 nm, such as between about 20 nm and about 100 nm, below the surface 726 of the second insulating layer 706, leaving the lower portion 723 (e.g., untreated region) of the second insulating layer 706 with a thickness between about 10 nm and about 300 nm, such as between about 20 nm and about 200 nm.

In one example, an optional mask (not shown) may be formed on the substrate surface, shielding the conductive wirings 704 from being ion doped during the ion implantation process. By doing so, ions may be selectively doped into the second insulating layer 706 from exposed surfaces 726 of the upper portion 721 without contaminating the conductive wirings 704. Furthermore, the doping energy may also be controlled during the ion implantation process so that some regions, such as the lower portion 723 of the second insulating layer 706 that is not intended to be doped, plasma treated, or be deposited thereon during the ion implantation process, may be selectively and/or intentionally left out during (i.e., not subject to) the ion implantation process, that the treated region 720 is formed substantially only on the upper portion 721 of the second insulating layer 706. The ion implantation process may alter the upper portion 721 of the second insulating layer 706 to form the treated region 720 to form desired doping profile/film bonding structure change as needed, providing the treated region 720 with altered film properties that enable obtaining different process results, e.g., providing etching selectivity, during the subsequent etching processes.

In one example, a doping gas mixture including a dopant gas may be utilized in the ion implantation/treatment process. The doping gas mixture may implant dopants into the second insulting layer 706, forming the treated region 720 with dopants doped therein. The dopants formed in the treated region 720 may alter a film property, such as different etching rate, compared to the lower portion 723 of the second insulating layer 706 which has essentially no ion treatment. The dopants doped in the treated region 720 define the interface 750 that may serve as an etching selectivity barrier at the subsequent etching process. The dopants as implanted may change the lattice structures of the substrate, thereby naturally forming a block interface, which has different atomic structures and properties than the underlying untreated lower portion 723, rendering a high selectivity interface for the subsequent etching process. As such, aggressive etchants from an etching process targeted to mainly etch the untreated lower portion 723, may be prevented from attacking the treated region 720 defined by the interface 750, rendering an air gap, e.g., a hole or an aperture, to be formed at the space, where the untreated lower portion 723 occupies within the second insulating layer 706, with desired profile and dimension control while maintaining a good integrity of the upper treated region 720 without damage or being attacked.

The dopants selected to be doped into the upper portion 721 of the second insulating layer 706 is configured to react with the etchant at a slower (or faster) etching rate to enhance the etching selectivity, as compared to the undoped lower portion 723 of the second insulating layer 706. By utilizing the etching rate difference between the treated region 720 and lower portion 723 of the second insulating layer 706, an etching barrier at the interface 750 may be formed to efficiently control an etching boundary during the etching process. Thus, by selecting proper ions to be doped in the second insulating layer 706, an efficient etching barrier/boundary may be created to enable an etching process with high selectivity. As a result, a selective etching may be obtained to mainly etch one type of material only in the second insulating layer 706, forming the desired air gaps, holes or apertures with desired dimension within the second insulating layer 706, thus obtaining a low-k value dielectric material from the second insulating layer 706. Thus, the high electivity of the etching process may assist forming desired etch profile and dimension so as to minimize etch depth/width variations for the air gaps, which often found by using conventional deposition techniques to form air gaps in a dielectric layer.

In one embodiment, the dopants selected to be implanted into the upper portion 721 of the second insulating layer 706 may be oxygen dopants, nitrogen dopants, carbon dopants, hydrogen dopants, silicon dopants, and the like. In one particularly embodiment, an oxygen dopant supplied from a oxygen containing gas, such as $O_2$, $H_2O$, $O_3$, $N_2O$, $NO_2$, and the like, may be doped into the upper portion 721 of the second insulating layer 706 to form the interface 750 as the etching barrier/boundary.

In some embodiment, an inert gas may also be supplied in the doping gas mixture along with the doping gas. Suitable examples of the inert gas include Ar, He, Kr, Ne, Xe or the like. In one embodiment, inert gas with high molecular weight, such as Ar, Ne, He or Kr, may be selected to perform the ion implantation/treatment process. As these elements have relatively high molecular weight, a relatively higher collision power may be obtained when striking the surface of the second insulating layer 706 so as to provide an efficient collision to alter and damage the lattice structure of the upper portion 721 of the second insulating layer 706 to facilitate the following etching process.

Several process parameters may be controlled during the directional plasma process. The ion doping gas mixture or inert gas may be supplied into the processing chamber at a flow rate between about 10 sccm and about 200 sccm. Suitable gases for supplying in the ion doping gas mixture include $O_2$, $H_2O$, $O_3$, $N_2O$, $NO_2$, $H_2$, $NH_3$, $CO_2$, $CO$, $N_2$, and Xe and the like. Suitable examples of the inert gas include Ar, He, Kr, Ne or the like. The chamber pressure is generally maintained between about 0.1 mTorr and about 100 mTorr, for example about 1 mTorr and about 100 mTorr, such as about 10 mTorr. A RF power, such as capacitive or inductive RF power, DC power, electromagnetic energy, or magnetron sputtering, may be supplied into the processing chamber 200 to assist dissociating the gas mixture during processing. Ions generated by the dissociative energy may be accelerated toward the substrate using an electric field produced by applying a DC or RF continuous or pulsed electrical bias to the substrate support or to a gas inlet above the substrate support, or both. In some embodiments, the ions may be subjected to a mass selection or mass filtration process, which may comprise passing the ions through a magnetic field aligned orthogonal to the desired direction of motion. The electric field provided by the RF power may be capacitively or inductively coupled for purposes of ionizing the atoms, and may be a DC discharge field or an alternating field, such as an RF field. Alternately, microwave energy may be applied to the ion implanting gas mixture containing any of these elements to generate ions. In some embodiments, the gas containing energetic ions may be a plasma. An electrical bias (peak to peak voltage) of between about 50 V and about 10000 V, such as about 4000V is applied to the substrate support, the gas distributor, or both, to accelerate the ions toward the substrate surface with the desired energy. In some embodiments, the electrical bias is also used to ionize the ion implantation processing gas. In other embodiments, a second electric field is used to ionize the process gas. In one embodiment, a RF field with a frequency of about 2 MHz is provided to ionize the ion implantation processing gas and bias the substrate support at a power level between about 100 W and about 10,000 W. The ions thus produced will generally be accelerated toward the substrate by biasing the substrate or a gas distributor as described above.

In some embodiments, the power used to generate ions may be pulsed. Power may be applied to the plasma source for a desired time, and then discontinued for a desired time. Power cycling may be repeated for a desired number of cycles at a desired frequency and duty cycle. In some embodiments, the plasma may be pulsed at a frequency between about 1 Hz and about 50,000 Hz, such as between about 5000 Hz and about 10000 Hz. In other embodiments, the plasma pulsing may proceed with a duty cycle (ratio of powered time to unpowered time per cycle) between about 10% and about 90%, such as between about 30% and about 70%. In one embodiment, the RF source power may be supplied at between about 100 Watts to about 5000 Watts, and the bias power may be supplied at between about 50 Watts and about 11000 Watts. The process temperature may be controlled at between about −110 degrees Celsius and about 650 degrees Celsius, such as between about 5 degrees Celsius and about 500 degrees Celsius.

It is noted that the implantation process performed at operation 606 may be operated in a single step manner that continuous implanting dopants into the substrate or in multiple steps to uniformly and gradually implant dopants into the substrate to create a uniform doping profile.

At operation 606, after the ion implantation, a selective etching process may be performed to remove the lower portion 723, e.g., untreated region, from the second insulating layer 706, as shown in FIG. 7C, forming air gaps 752 below the interface 750 in the second insulating layer 706. The etching process may be a wet etching process or a dry etching process utilizing a plasma process. In the example wherein a wet etching process is performed, an acid solution including diluted HF liquid may be utilized to etch away the lower portion 723 of the second insulating layer 706.

In the embodiment wherein a dry etching process is utilized, an etching gas mixture is supplied into a processing chamber with a remote plasma source, such as the processing chamber 500 depicted in FIG. 5, to etch the lower portion 723, until an surface 714 of the underlying first insulating layer 702 is exposed, forming air gaps 752 within the second insulating layer 706. As discussed above, the interface 750 servers as an etching barrier/boundary during the etching process so as to prevent the treated region 720 from being attacked during the etching process. The etching gas mixture selected to etch the lower portion 723 includes at least a halogen containing gas, such as fluorine containing gas, chlorine containing gas, or bromide containing gas or the like supplied from a remote plasma source, or from a plasma maintained in the processing chamber as needed. The plasma supplied from the remote source may provide a gentle source that may mildly and gradually etch the lower portion 723, e.g., the untreated region, without overly attacking the upper portion 721, e.g., treated region 720, of the second insulating layer 706. In one example, a $CF_4$ gas is utilized to form a remote plasma source to etch the lower portion 723.

It is noted that prior to performing the etching process at operation 606, a cross-sectional cut process may be performed to expose the lower portion 723 of the second insulating layer 706 for etching. The cross-sectional cut process may be performed by a focus ion beam (FIB) process or other suitable cleavage/cutting processes to selectively cut the substrate in cross-sectional direction so as to expose the cross-section of the second insulating layer 706 to be subject to the selective etching process. After the etching process at operation 606, a light deposition process may be performed to seal the cutting interface/surface to recover the interconnection structure for further processes so as to complete the subsequent semiconductor manufacturing processes.

In the implementation wherein the lower portion 723 includes oxygen dopants formed therein, a fluorine containing gas having a formula $C_xF_yH_z$, wherein x, y and z are integers ranging from 1 to 18 respectively, may be used to etch the lower portion 723. Suitable examples of the fluorine containing gas include $CF_4$, $C_2F_6$, $C_3F_8$, $C_4F_{10}$, $NF_3$, combinations thereof and the like. In some examples, $NH_3$ may also be used as needed.

While supplying the etching gas mixture, an inert gas may also be supplied into the etching gas mixture to assist the profile control as needed. Examples of the inert gas supplied in the gas mixture include Ar, He, Ne, Kr, Xe or the like. In one embodiment, the hydrocarbon gas supplied in the etching gas mixture may be maintained at a flow rate by volume between about 10 sccm and about 400 sccm, such as 30 sccm and about 150 sccm. The optional inert gas may be supplied to the processing chamber at a flow rate by volume between about 50 sccm and about 300 sccm.

After the etching gas mixture is supplied to the processing chamber mixture, a RF power of remote plasma source may be supplied in the etching gas mixture for between about 200 Watts and about 3,000 Watts. In some examples, a RF source power may also be supplied to form a plasma from the etching gas mixture within the processing chamber. The RF source power may be supplied at the etching gas mixture between about 300 Watts and about 3000 Watts and at a frequency between about 400 kHz and about 100 MHz. A RF bias power may also be supplied as needed. The RF bias power may be supplied at between about 300 Watts and about 1500 Watts. In one embodiment, the RF source power may be pulsed with a duty cycle between about 10 to about 95 percent at a RF frequency between about 100 Hz and about 10 MHz.

Several process parameters may also be controlled while supplying the etching gas mixture to perform the etching process. The pressure of the processing chamber may be controlled at between about 0.5 milliTorr and about 500 milliTorr, such as between about 2 milliTorr and about 10 milliTorr. A substrate temperature is maintained between about 15 degrees Celsius to about 300 degrees Celsius, such as greater than 50 degrees Celsius, for example between about 60 degrees Celsius and about 90 degrees Celsius. It is believed that high temperature, temperature greater than 50 degrees Celsius, helps reduce the amount of etching byproduct deposition on the substrate. The etching process may be performed for between about 30 seconds and about 180 seconds to etch the metal liner layer 708 with a thickness for between about 200 Å and about 1200 Å.

At operation 608, after the etching process, the lower portion 723 of the second insulating layer 706 is then removed, forming the air gaps 752 with predefined dimension, e.g., having a depth 728, within the interconnection structure 700. By utilizing the material property difference, a selective etching process is performed to selectively and only remove the lower portion 723 of the second insulating layer 706 from the substrate 102 with controllable, reliable and predicable dimension, profile, and size of the air gaps 752 formed within the interconnection structure 700.

Thus, methods for forming interconnection structures with desired profile and dimensions of air gaps in an insulating material for semiconductor chips are provided. The methods utilize an ion implantation process to ion ions to the insulating materials in an interconnection structure, forming a natural etching barrier to promote etching selectivity. An etching process is utilized to selectively remove areas with mismatched profiles and film properties to form air gaps with controllable, reliable and predicable dimension, profile, and size. As such, an interconnection structure with predicable profile/sizes of air gaps with desired low k value is then obtained.

While the foregoing is directed to embodiments of the present invention, other and further embodiments of the invention may be devised without departing from the basic scope thereof, and the scope thereof is determined by the claims that follow.

The invention claimed is:

1. A method for forming air gaps in an interconnection structure on a substrate, the method comprising:
   implanting ions in a first region of an insulating material disposed on a substrate, leaving a second region without implanted ions, the second region having a first surface interfaced with the first region and a second surface interfaced with the substrate; and
   performing an etching process to selectively etch the second region away from the substrate utilizing the first region of the insulating material as an etching boundary, forming an air gap between the etching boundary and the substrate.

2. The method of claim 1, wherein the etching process is a wet etching process.

3. The method of claim 1, wherein the etching process is a dry etching process utilizing a remote plasma etching process, the remote plasma etching process further comprising:
   forming a remote plasma from a gas mixture including a fluorine containing gas.

4. The method of claim 3, wherein the fluorine containing gas is selected from a group consisting of $CF_4$, $C_2F_6$, $C_3F_8$, $NF_3$ and $C_4F_{10}$.

5. The method of claim 1, wherein a plurality of metal wirings is formed in the insulating material.

6. The method of claim 1, wherein performing the ion implantation process further comprises:
   supplying a gas mixture including an oxygen containing gas during the ion implantation process.

7. The method of claim 6, wherein the oxygen containing gas is selected from a group consisting of $O_2$, $H_2O$, $O_3$, $N_2O$ and $NO_2$.

8. The method of claim 1, further comprising:
   etching the second region utilizing the etching boundary formed in the first region to promote etching selectivity.

9. The method of claim 1, wherein the insulating material is a silicon containing low dielectric constant material having a dielectric constant less than 4.

10. The method of claim 1, wherein the first region and the second region have different etching rate, providing an etching selectivity during the etching process.

11. The method of claim 1, wherein performing the etching process to selectively etch the second region further comprises:
    performing a surface cut process to a substrate surface to expose a cross-section of the substrate, exposing the first and the second region of the insulating material in cross-section prior to performing the etching process.

12. The method of claim 11, further comprising:
    performing a surface deposition process to seal the substrate surface after performing and etching process.

13. The method of claim 1, wherein the ion implantation process is a plasma ion immersion process or an ion beam implantation process performed in a single step or in multiple steps.

14. The method of claim 1, wherein the insulating material is utilized in the interconnection structure.

15. A method for forming air gaps in an interconnection structure on a substrate, the method comprising:
    altering film properties of a first region of an insulating material disposed on a substrate while leaving the film properties of a second region of the insulating material unchanged; and
    selectively removing the second region of the insulating material from the substrate utilizing the first region of the insulating material as an etching boundary to form air gaps between the etching boundary and the substrate.

16. The method of claim 15, wherein altering the film properties of the first region further comprises:
    performing an ion implantation process to dope ions into the first region of the insulating material.

17. The method of claim 15, wherein selectively removing the second region of the insulating material further comprises:
    performing an wet etching or a dry etching process to remove the second region of the insulating material from the substrate.

18. The method of claim 16, wherein performing the ion implantation process further comprises:
    implanting oxygen ions into the first region of the insulating material.

19. A method for forming air gaps in an interconnection structure on a substrate, the method comprising:
    forming an etching boundary by implanting ions to a first region of an insulating material disposed on a substrate to a predetermine depth, leaving a second region of the insulating material without ions implanted; and
    selectively removing the second region of the insulating material from the substrate using the predetermined depth as the etching boundary, wherein the second region of the insulating material removed from the substrate forms air gaps between the substrate and the etching boundary.

* * * * *